United States Patent
Iwamatsu (10) Patent No.: US 8,110,852 B2
(45) Date of Patent: Feb. 7, 2012

(54) SEMICONDUCTOR INTEGRATED CIRCUIT DEVICE

(75) Inventor: Toshiaki Iwamatsu, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/906,720

(22) Filed: Oct. 18, 2010

(65) Prior Publication Data

US 2011/0031535 A1 Feb. 10, 2011

Related U.S. Application Data

(62) Division of application No. 11/733,351, filed on Apr. 10, 2007, now Pat. No. 7,834,377.

(30) Foreign Application Priority Data

Apr. 12, 2006 (JP) ................................. 2006-109733

(51) Int. Cl.
H01L 29/74 (2006.01)
H01L 27/12 (2006.01)
H01L 27/108 (2006.01)

(52) U.S. Cl. ......... 257/147; 257/48; 257/290; 257/291; 257/412; 257/368; 257/66; 257/413; 257/72

(58) Field of Classification Search ................. 257/338, 257/371, 206, 500, 401
See application file for complete search history.

(56) References Cited

U.S. PATENT DOCUMENTS

| 6,255,705 | B1 * | 7/2001 | Zhang et al. | 257/412 |
| 6,385,159 | B2 | 5/2002 | Hidaka et al. | |
| 6,710,371 | B2 * | 3/2004 | Kitahara et al. | 257/69 |
| 7,068,552 | B2 | 6/2006 | Kawasumi | |
| 7,242,060 | B2 * | 7/2007 | Hidaka et al. | 257/351 |
| 7,834,377 | B2 * | 11/2010 | Iwamatsu | 257/147 |
| 2004/0251484 | A1 | 12/2004 | Miyazaki et al. | |
| 2005/0001254 | A1 * | 1/2005 | Hidaka et al. | 257/296 |
| 2005/0040461 | A1 | 2/2005 | Ono et al. | |
| 2006/0113533 | A1 * | 6/2006 | Tamaki et al. | 257/48 |

FOREIGN PATENT DOCUMENTS

| JP | 2000-243973 | 9/2000 |
| JP | 2000-349165 | 12/2000 |

* cited by examiner

*Primary Examiner* — Kenneth Parker
*Assistant Examiner* — David Spalla
(74) *Attorney, Agent, or Firm* — Oblon, Spivak, McClelland, Maier & Neustadt, L.L.P.

(57) ABSTRACT

A finger length a1 of a transistor P11 is longer than a finger length A1 of a transistor P1, and a finger length b1 of a transistor N11 is longer than a finger length B1 of a transistor N1. The finger length b1 of the transistor N11 is shorter than the finger length A1 of the transistor P1, and the relation: a1>A1>b1>B1 is established. In a relation between an I/O section and a logic circuit section, as for MOS transistor of the same conductive type, a finger length of a MOS transistor constituting the logic circuit section is set so as to be longer than a finger length of a MOS transistor constituting the I/O section.

7 Claims, 6 Drawing Sheets

SEMICONDUCTOR INTEGRATED CIRCUIT DEVICE

CROSS-REFERENCE TO RELATED APPLICATIONS

This application is a divisional of U.S. application Ser. No. 11/733,351, filed Apr. 10, 2007, the entire contents of which are incorporated herein by reference, and is based upon and claims the benefit of priority from prior Japanese Patent Application No. 2006-109733, filed Dec. 4, 2006.

BACKGROUND OF THE INVENTION

1. Field of the Invention

The present invention relates to a semiconductor integrated circuit device, and particularly relates to a semiconductor integrated circuit device provided on an SOI substrate.

2. Description of the Background Art

In a current semiconductor integrated circuit device (LSI) having a plurality of circuit sections with different functions, such as an input/output circuit (I/O) section, a logic circuit section and a memory section, a configuration is adopted where a plurality of voltages are supplied from external power supplies.

For example, an LSI with two power supplies has been used in relatively many practical uses, in which a 3.3 V power supply is used for the input/output circuit section and a 1.2 V power supply is used for a core circuit section corresponding to core portions of the LSI such as the logic circuit section and the memory circuit section.

Here, a structure (a gate length and a thickness of a gate insulating film) of a MOS transistor included in each of the circuit sections that constitute the LSI differs depending upon a power voltage, and a channel width of the MOS transistor also differs depending upon the circuit section.

For example, in the MOS transistor in the input/output circuit section using the 3.3 V power supply, the channel width is set to not less than 100 μm. This is because, as disclosed in Japanese Patent Application Laid-Open No. 2000-349165 (FIG. 3), the MOS transistor in the input/output circuit section is required to have excellent noise resistance.

On the other hand, in the core circuit section such as the logic circuit section and the memory circuit section, the channel width is set to the order of several μm for the purpose of improving a package density.

As thus described, the input/output circuit section and the circuit section are significantly different in MOS transistor structure. In particular, the MOS transistor constituting the input/output circuit section has been required to have a long channel width. However, in order to respond to such a requirement by only one gate electrode, a length of the gate electrode in the channel width direction would naturally become not less than 100 μm.

Here, the input/output circuit section is provided along the end edge of the LSI due to the nature of its function. The shape of the provided region in a plan view is often slim rectangular, and the length of the gate electrode of the MOS transistor in the channel width direction cannot be made longer without restriction.

Therefore, a configuration has been adopted where a plurality of gate electrodes having the same length are provided in parallel and a plurality of MOS transistors are connected in parallel in place of one MOS transistor having one long gate electrode.

In this case, a total of lengths (referred to as finger lengths) of a portion on an active region (here, SOI layer) of each of the gate electrodes is a channel width. The finger lengths of the plurality of gate electrodes are set so as to correspond to a channel width of one MOS transistor having one long gate electrode.

For example, in a case where a MOS transistor having a channel width of 100 μm is required, restriction on area has been avoided by aligning two MOS transistors in parallel each having a finger length of 50 μm or aligning four MOS transistors in parallel each having a finger length of 25 μm.

As thus described in the input/output circuit section of the conventional LSI, the structure of the MOS transistor was determined only on ground of restriction on area, and this is because a bulk device, which is a semiconductor device formed directly on a silicon substrate called bulk substrate, was a subject to be obtained. On an SOI device which is currently mainstream, there are restrictions as described below.

Namely, a semiconductor device formed on an SOI (silicon on insulator) substrate, so-called SOI device, which is provided sequentially with a buried oxide film and an SOI film has a characteristic of being capable of reducing a parasitic capacitance so as to perform a stable operation at high speed with low power consumption, and has been in use for mobile devices.

One of examples of the SOI device is an SOI device with a full trench separation (FTI) structure where elements are electrically isolated by a full trench isolation insulating film formed by providing a trench reaching the buried oxide film within the surface of the SOI layer and then burying an insulator into the trench.

However, there have been a variety of problems generated by a substrate floatation effect, including a problem in that carriers (holes in NMOS) generated by a collisional ionization phenomenon remain in a body region including a channel formation region, thereby to cause generation of a kink, reduction in operating withstand voltage, and generation of dependency of delayed time on a frequency due to an unstable potential of the body region.

With this being the situation, a partial trench isolation (PTI) structure was contrived as disclosed in Japanese Patent Application Laid-Open No. 2000-243973 (FIGS. 1 to 3). This structure has a partial trench isolation insulating film formed by forming a trench within the surface of the SOI layer such that the SOI layer with a prescribed thickness remains between the bottom of the trench and a buried oxide film and then burying an insulator into the trench.

Adoption of the PTI structure allows shift of carriers through a well region in the lower portion of the partial trench isolation insulating film so as to prevent the carriers from remaining in the body region, and also allows fixing of a potential of the body region through the well region. Accordingly, the variety of problems caused by the substrate floatation effect are not generated.

In the case of adopting the PTI structure, typically, a high density impurity region of the same conductivity type as that of the body region is provided as a body contact region within the surface of the SOI layer on the outside of the end of the gate electrode in the gate width direction, and the body contact region is electrically connected to a wiring layer as an upper layer, to fix a potential of the body region.

However, in the case of adopting the PTI structure, when the channel width of the MOS transistor is increased without restriction, the body region under the gate electrode becomes longer, resulting in that body resistance increases to make it difficult to fix a potential of the body region, leading to a problem of deterioration in transistor characteristic caused by the substrate floatation effect.

As thus described, there has been a problem in the SOI device with the SOI structure adopted therein in that the length of the MOS transistor in the channel width direction cannot be increased from the aspect of suppressing deterioration in transistor characteristic, and it has not been possible to solve the problem by a conventional design index of arranging gate electrodes in parallel to avoid restriction on area.

SUMMARY OF THE INVENTION

There is provided a semiconductor integrated circuit device, which is provided on an SOI substrate and includes an input/output circuit section and a core circuit section and in which a power-supply voltage of the input/output circuit section is higher than a power-supply voltage of the core circuit section, wherein deterioration in characteristic caused by a substrate flotation effect of a MOS transistor constituting the input/output circuit section can be prevented.

A first mode of the semiconductor integrated circuit device according to the present invention is provided on an SOI substrate and includes: an input/output circuit section; and a core circuit section, which is provided more internally than the input/output circuit section and operate at a lower power supply voltage than the input/output circuit section. The input/output circuit section has a first MOS transistor of a first conductivity type. The core circuit section has a second MOS transistor of the first conductivity type. A first finger length of a first gate electrode of the first MOS transistor, which is defined by a length of a portion on an active region, is set shorter than a second finger length of a second gate electrode of the second MOS transistor, which is defined by a length of a portion on an active region.

As thus described, in an input/output circuit section, a first finger length of a first gate electrode of a first MOS transistor, which is defined by a length of a portion on an active region, is set shorter than a second finger length of a second gate electrode of the second MOS transistor, which is defined by a length of a portion on an active region. Therefore, ever when a collisional ionization phenomenon apparently occurs at a drain end of the MOS transistor, it is possible in the input/output circuit section to which a higher power supply voltage is supplied than the core circuit section to suppress a substrate floatation effect with reliability, so as to prevent deterioration in transistor characteristic caused by the substrate floatation effect.

A second mode of the semiconductor integrated circuit device according to the present invention is provided on an SOI substrate and includes: an input/output circuit section; and a core circuit section, which is arranged more internally than the input/output circuit section and operates at a lower power-supply voltage than the input/output circuit section. The input/output circuit section has a plurality of kinds of MOS transistors in a first group. The core circuit section has a plurality of kinds of MOS transistors in a second group. A finger length of each of gate electrodes of the plurality of kinds of MOS transistors in the first group in the input/output circuit section is different, the length being defined by a length of a portion on an active region. A finger length of each of gate electrodes of the plurality of kinds of MOS transistors in the second group in the core circuit section is different, the length being defined by a length of a portion on an active region. The maximum finger length among the respective finger lengths of the plurality of kinds of MOS transistors in the first group is shorter than the maximum finger length among the respective finger lengths of the plurality of kinds of MOS transistors in the second group.

As thus described, in an input/output circuit section, the maximum finger length among respective finger lengths of a plurality of kinds of MOS transistors in a first group is set shorter than the maximum finger length among respective finger lengths of a plurality of kinds of MOS transistors in a second group. Therefore, in a case where a plurality of kinds of MOS transistor having different finger lengths are provided within the same one circuit, even when a collisional ionization phenomenon apparently occurs at a drain end of the MOS transistors, it is possible in the input/output circuit section to which a higher power supply voltage is supplied than the core circuit section to suppress a substrate floatation effect with reliability, so as to prevent deterioration in transistor characteristic caused by the substrate floatation effect.

These and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Embodiment

A. Regarding Fixing of Potential of Body Region

Figure 1:
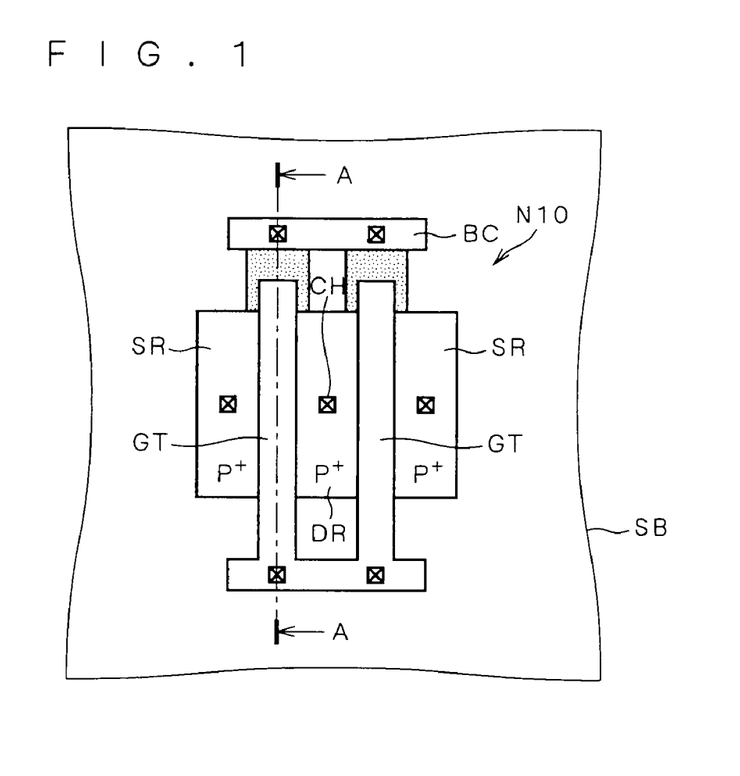
FIG. 1 is a plan view for explaining fixing of a potential of a body region in an SOI device with a PTI structure adopted therein.
Figure 2:
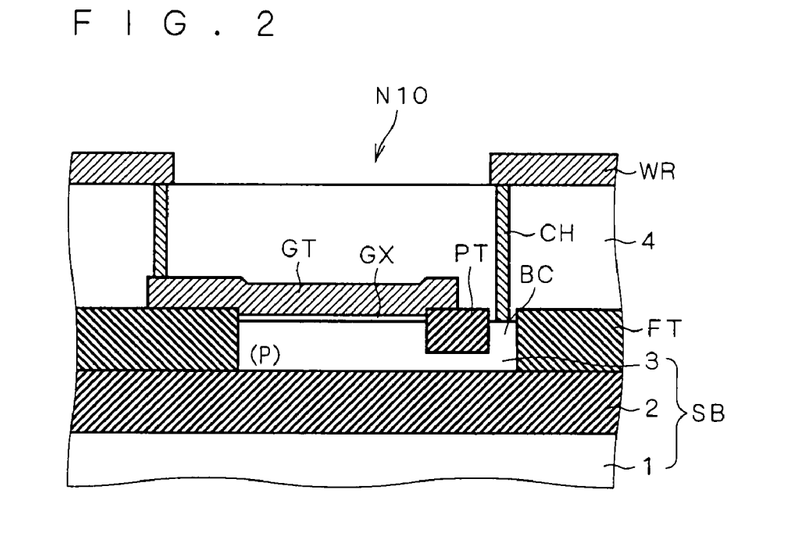
FIG. 2 is a sectional view for explaining fixing of a potential of the body region in the SOI device with the PTI structure adopted therein.

First, fixing of a potential of a body region in an SOI device with the PTI structure adopted therein is described using FIGS. 1 and 2.

FIG. 1 is a view showing a plane configuration of $\alpha\alpha$ MOS transistor (NMOS transistor) N10 with the PTI structure adopted therein. FIG. 2 is a sectional view on arrow A-A of FIG. 1. In FIG. 1, two gate electrodes GT are provided in parallel in a gate length direction on an SOI substrate SB. A drain region DR in which P-type impurities have been introduced is provided between the two gate electrodes GT within the surface of the SOI substrate SB. The source region SR in which the P-type impurities have been introduced is provided on the outside side surface of the gate electrode GT on the opposite side to the drain region DR within the surface of the SOI substrate SB.

A body contact region BC is provided on the outside of one end of the two gate electrodes GT in a gate width direction, in a position apart from an active region including the drain region DR and the source region SR.

The body contact region BC is an impurity region for fixing a potential of a body region corresponding to the SOI layer region immediately under the gate electrode GT. A partial trench isolation insulating film PT is provided between the body contact region BC and the active region.

It is to be noted that the drain region DR, the source region SR and the body contact region BC are connected to wiring (not shown) in an upper layer through a contact portion CH. And the other ends of gate electrodes GT in the gate width direction are connected so as to be a common gate electrode, and is connected to wiring (not shown) in an upper layer through a contact portion CH.

Further, as shown in FIG. 2, the SOI substrate SB has a configuration where an oxide film 2 and an SOI layer 3 are sequentially provided on a substrate 1, and a gate insulating film GX is provided between the gate electrode GT and the SOI layer 3.

Moreover, a configuration is made such that an interlayer insulating film 4 is provided so as to cover the SOI substrate SB including the gate electrode GT, and the wiring layer WR is provided on the interlayer insulating film 4 to be connected to the contact portion CH.

Subsequently, the structure is made such that a full trench isolation insulating film having such a thickness as to reach the buried oxide film 2 is provided so as to define the active region including the drain region DR and the source region SR, and thereby, elements are fully isolated electrically.

The partial trench isolation insulating film PT, formed such that the SOI layer 3 remains between the bottom and the oxide film, is provided between the body contact region BC and the active region, and the body contact region BC is electrically connected to the body region through the SOI layer 3 (well region) under the partial trench isolation insulating film PT.

It is to be noted that the NMOS transistor N10 has a configuration comprising the body contact region capable of fixing a potential of the body region to the outside of one end out of both ends of the body region in the gate width direction. As thus described, the configuration comprising the body contact region on the outside of one end of the body region in the gate width direction is called one-side potential fixing.

With this configuration, it is possible to shift carriers through the well region under the partial trench isolation insulating film, and thus prevent the carriers from remaining in the body region and fix a potential of the body region through the well region, so as to prevent a variety of kinds of problems caused by the substrate floatation effect.

However, since resistance of the body region under the gate electrode GT in the SOI device is higher than in the bulk device, the finger length in the SOI device is made shorter than in the bulk device.

Further, as a power-supply voltage becomes higher, a collisional ionization phenomenon at the drain end occurs more apparently, whereby the substrate floatation effect occurs more apparently. Therefore, the finger length of the MOS transistor in the input/output circuit section at a higher power supply voltage is made shorter than in the core circuit section at a lower power-supply voltage. This is a basic technical idea of the present invention.

Figure 3:
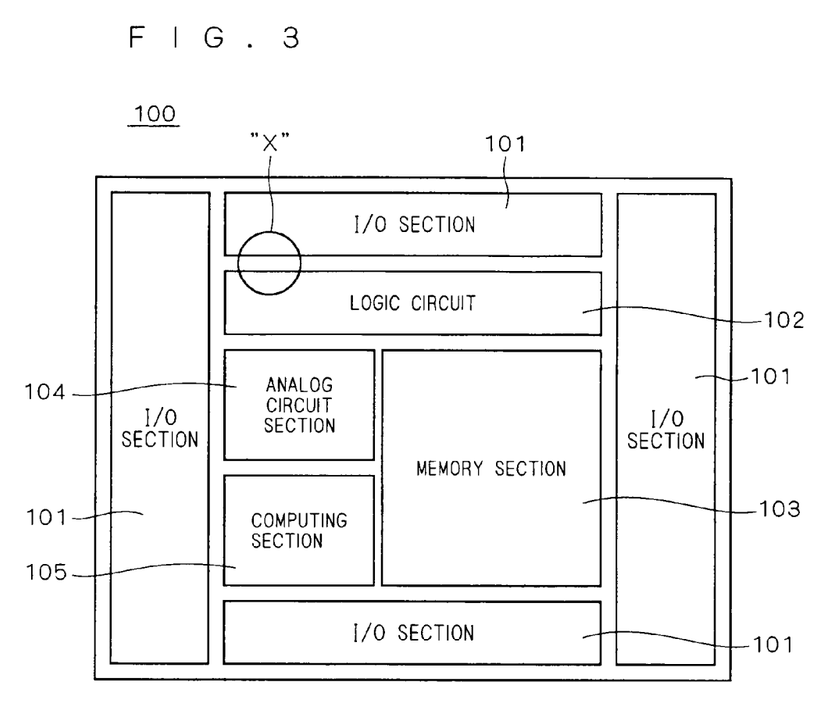
FIG. 3 is a block diagram showing one of examples of a whole configuration of a semiconductor integrated circuit device to which the present invention is applied.

First, one of examples of the whole configuration of the semiconductor integrated circuit device to which the present invention is applied is described using a block diagram shown in FIG. 3.

A semiconductor integrated circuit device 100 shown in FIG. 3 includes an input/output (I/O) circuit section 101, a logic circuit section 102, a memory section 103, an analog section 104, and a computing section 105. The I/O section 101 is provided along four sides of the semiconductor integrated circuit device 100. The circuit sections except for the input/output I/O section 101 are a so-called core circuit section. A 3.3 V power supply is used for the input/output circuit section, and a 1.2 V power supply is used for the core circuit section.

It should be noted that the above configuration is one of examples, and application of the present invention is not limited to this. The present invention is applicable to any semiconductor integrated circuit device so long as the device has an input/output circuit section and a core circuit section.

B. First Constitutional Example of Device

Figure 4:
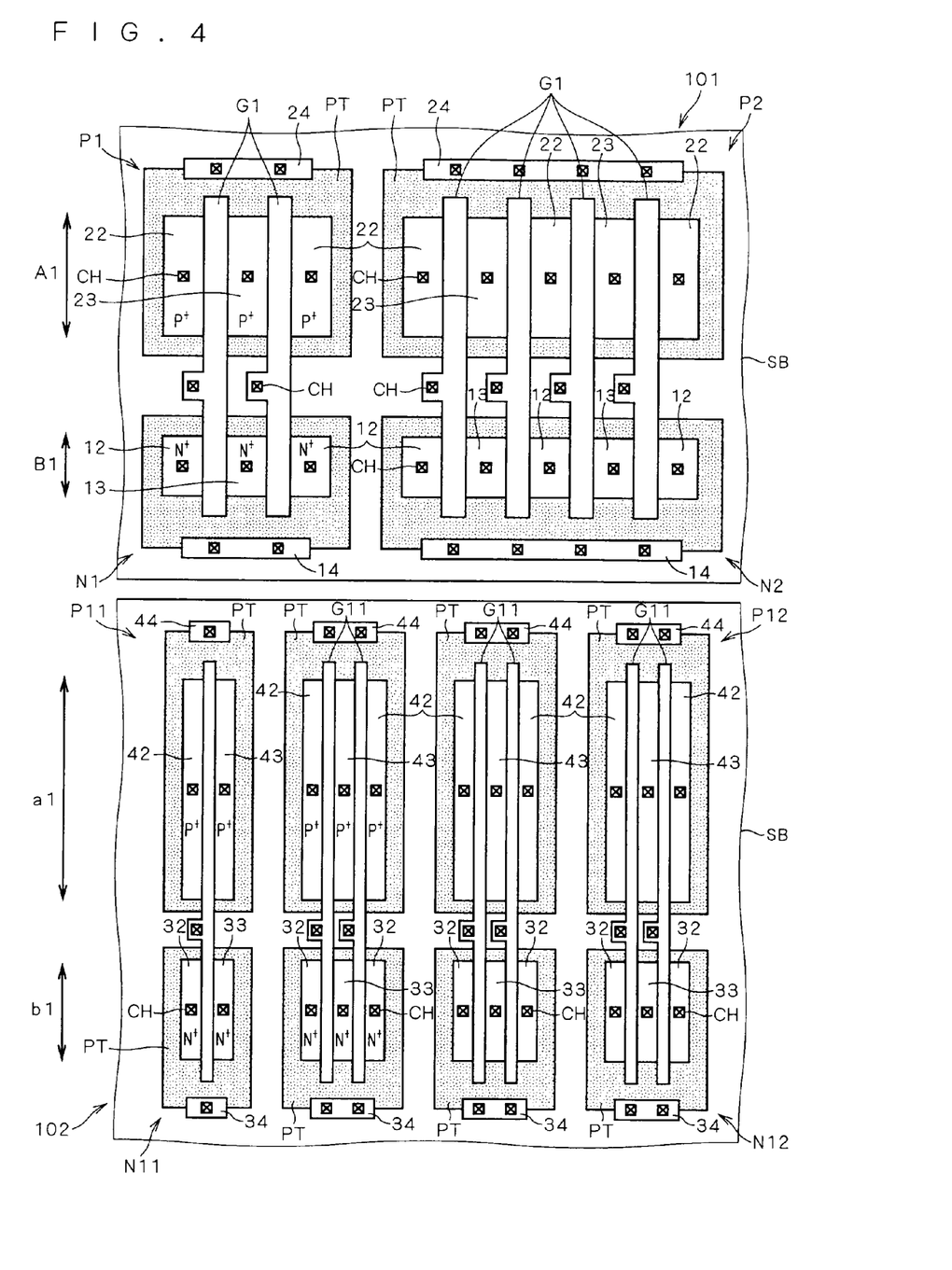
FIG. 4 is a plan view for explaining a first constitutional example of the semiconductor integrated circuit device according to the present invention.

Next, a first constitutional example of the I/O section 101 and the logic circuit section 102 is described using FIG. 4 that shows a detail of a region X across the I/O section 101 and the logic circuit section 102 in FIG. 3.

B-1. Configuration of I/O Section

In FIG. 4, the I/O section 101 is provided with: a transistor column where a P-channel type MOS transistor (PMOS transistor) P1 and an N-channel type MOS transistor (NMOS transistor) N1 are provided in parallel in the gate width direction, and the gate electrodes G1 of both transistors are connected so as to be a common gate electrode; and a transistor column where a PMOS transistor P2 and an NMOS transistor N2 are provided in parallel in the gate width direction, and the gate electrodes G1 of both transistors are connected so as to be a common gate electrode.

Here, the PMOS transistor P1 and the NMOS transistor N1 have two gate electrodes G1 provided in parallel in the gate length direction. In the PMOS transistor P1, a drain region 23 in which P-type impurities have been introduced is provided between the gate electrodes G1 within the surface of the SOI substrate SB, and a source region 22 in which P-type impurities have been introduced is provided between the gate electrodes G1 on the outside of the side surface of each of the gate electrodes G1 on the opposite side to the drain region 23 within the surface of the SOI substrate SB. Therefore, the PMOS transistor P1 has a configuration where two PMOS transistors are connected in parallel, but those are treated as one transistor for the sake of convenience.

Similarly, in the NMOS transistor N1, a drain region 13 in which N-type impurities have been introduced is provided between the gate electrodes G1 within the surface of the SOI substrate SB, and a source region 12 in which N-type impurities have been introduced is provided between the gate electrodes G1 on the outside of the side surface of each of the gate electrodes G1 on the opposite side to the drain region 13 within the surface of the SOI substrate SB. Therefore, the NMOS transistor N1 has a configuration where two NMOS transistors are connected in parallel, but those are treated as one transistor for the sake of convenience.

The periphery of the active region of each of the PMOS transistor P1 and the NMOS transistor N1 is surrounded by the partial trench isolation insulating film PT, and body contact regions 24 and 14 are provided on the outside of both ends of the two gate electrodes G1 in the gate width direction, in positions apart from the respective active regions. It should be noted that the full trench isolation insulating film is formed outside the partial trench isolation insulating film PT within the surface of the SOI substrate SB.

Both the body contact regions 24 and 14 are provided continuously along the arrangement direction of the two gate electrodes G1. It is to be noted that each of the body contact regions 24 and 14 is provided on a boundary portion between the partial trench isolation insulating film PT and the full trench isolation insulating film.

Adoption of such a configuration allows fixing of a potential of each end of the body region in the gate width direction in each of the PMOS transistor P1 and the NMOS transistor N1, so as to make body resistance of the body region substantially half as large as in the case of the one-side potential fixing. As thus described, a configuration comprising a body contact region capable of fixing a potential of a body region on the outside of each end of the body region in the gate width direction is called both-side potential fixing.

Further, each of the PMOS transistor P2 and the NMOS transistor N2 has four gate electrodes G1 provided in parallel in the gate length direction, and the PMOS transistor P2 has a configuration where four PMOS transistors are connected in parallel, but those are treated as one transistor for the sake of convenience. It should be noted that the basic transistor structure is the same as that of the PMOS transistor P1 and its description is thus omitted.

Similarly, the NMOS transistor N2 has a configuration where four NMOS transistors are connected in parallel, but those are treated as one transistor for the sake of convenience. It should be noted that the basic transistor structure is the same as that of the NMOS transistor N1 and its description is thus omitted.

B-2. Configuration of Logic Circuit Section

Further, the logic circuit section 102 is provided with: a transistor column where a PMOS transistor P11 and an NMOS transistor N11 are provided in parallel in the gate width direction, and the gate electrodes G11 of both transistors are connected so as to be a common gate electrode; and a transistor column where a PMOS transistor P12 and an NMOS transistor N12 are provided in parallel in the gate width direction, and the gate electrodes G11 of both transistors are connected so as to be a common gate electrode.

Here, the number of gate electrodes G11 in common between the PMOS transistor P11 and the NMOS transistor N11 is one, and in the PMOS transistor P11, a source region 42 and a drain region 43 in which the P-type impurities have been introduced are provided on the outside of both side surfaces of the gate electrode G11 in the gate length direction within the surface of the SOI substrate SB.

Similarly, in the NMOS transistor N11, a source region 32 and a drain region 33 in which the N-type impurities have been introduced are provided on the outside of both side surfaces of the NMOS transistor N11 in the gate length direction within the surface of the SOI substrate SB.

The periphery of the active region of each of the PMOS transistor P11 and the NMOS transistor N11 is surrounded by the partial trench isolation insulating film PT, and body contact regions 44 and 34 are provided on the outside of both ends of the two gate electrodes G11 in the gate width direction, in positions apart from the respective active regions. It should be noted that the full trench isolation insulating film is formed outside the partial trench isolation insulating film PT within the surface of the SOI substrate SB.

In addition, each of the body contact regions 44 and 34 is provided on a boundary portion between the partial trench isolation insulating film PT and the full trench isolation insulating film Adoption of such a configuration allows fixing of a potential of each end of the body region in the gate width direction in each of the PMOS transistor P11 and the NMOS transistor N11, so as to make body resistance of the body region substantially half as large as in the case of the one-side potential fixing.

Further, each of the PMOS transistor P12 and the NMOS transistor N12 has two gate electrodes G11 provided in parallel in the gate length direction. In the PMOS transistor P12, the drain region 43 in which the P-type impurities have been introduced is provided between the gate electrodes G11 within the surface of the SOI substrate SB. And a source region 42 in which P-type impurities have been introduced is provided between the gate electrodes G11 on the outside of the side surface of each of the gate electrodes G11 on the opposite side to the drain region 43 within the surface of the SOI substrate SB. Therefore, the PMOS transistor P12 has a configuration where two PMOS transistors are connected in parallel, but those are treated as one transistor for the sake of convenience.

Similarly, in the NMOS transistor N12, the drain region 33 in which the N-type impurities have been introduced is provided between the gate electrodes G11 within the surface of the SOI substrate SB, and a source region 32 in which N-type impurities have been introduced is provided between the gate electrodes G11 on the outside of the side surface of each of the gate electrodes G11 on the opposite side to the drain region 33 within the surface of the SOI substrate SB. Therefore, the NMOS transistor N12 has a configuration where two NMOS transistors are connected in parallel, but those are treated as one transistor for the sake of convenience.

The periphery of the active region of each of the PMOS transistor P12 and the NMOS transistor N12 is surrounded by the partial trench isolation insulating film PT, and body contact regions 44 and 34 are provided on the outside of both ends of the two gate electrodes G11 in the gate width direction, in positions apart from the respective active regions. It should be noted that the full trench isolation insulating film is formed outside the partial trench isolation insulating film PT within the surface of the SOI substrate SB.

Both of the body contact regions 44 and 34 are provided continuously along the arrangement direction of the two gate electrodes G11. It is to be noted that each of the body contact regions 44 and 34 is provided on a boundary portion between the partial trench isolation insulating film PT and the full trench isolation insulating film.

In addition, it goes without describing that the both-side potential fixing is also adopted in the PMOS transistor P12 and the NMOS transistor N12.

B-3. Comparison Between I/O Section and Logic Circuit Section

Next, MOS transistors constituting the I/O section 101 and the logic circuit section 102 is subjected to comparison with reference to FIG. 4.

First, a focus is placed on the transistor column consisting of the PMOS transistor P1 and the NMOS transistor N1 in the I/O section 101. This transistor column is configured such that a finger length (length of a portion on the active region of the gate electrode) A1 of the gate electrode G1 of the PMOS transistor P1 is made about twice as long as a finger length B1 of the gate electrode G1 of the NMOS transistor N1. This also applies to the PMOS transistor P2 and the NMOS transistor N2.

Here, in the PMOS transistor P2 and the NMOS transistor N2, since four each of PMOS transistors and NMOS transistors are connected in parallel, respective total finger lengths of the PMOS transistor P2 and the NMOS transistor N2 are gate widths of the PMOS transistor P2 and the NMOS transistor N2, and are twice as wide as the gate widths of the PMOS transistor P1 and the NMOS transistor N1.

It should be noted that the reason for configuring the MOS transistor such that the finger length A1 of the gate electrode G1 of the PMOS transistor P1 (P2) is about twice as long as the finger length B1 of the gate electrode G1 of the NMOS transistor N1 (N2) is described below.

The following relation is established between the NMOS transistor and the PMOS transistor. A current amount per unit channel width of the NMOS transistor is about twice as large as that of the PMOS transistor, and as for the maximum finger length with which the substrate floatation effect can be suppressed in each of the NMOS transistor and the PMOS transistor, about one-half of the maximum finger length of the PMOS transistor corresponds to the maximum finger length of the NMOS transistor N. This is not limited to the I/O section 101, but also applies to the core circuit section.

Next, a focus is placed on the transistor column consisting of the PMOS transistor P 11 and the NMOS transistor N11 in the logic circuit section 102. This transistor column is configured such that a finger length a1 of the gate electrode GT of the PMOS transistor P11 is made about twice as long as a finger length b1 of the gate electrode G1 of the NMOS transistor N11. This also applies to the PMOS transistor P12 and the NMOS transistor N12.

Next, a focus is placed on the finger length of each of the PMOS transistor P1 and the NMOS transistor N1 in the I/O section 101 and the PMOS transistor P11 and the NMOS transistor N11 in the logic circuit section 102, to find the magnitude relation of these finger lengths as follows.

Namely, the finger length a1 of the PMOS transistor P11 is longer than the finger length A1 of the PMOS transistor P1, and the finger length b1 of the NMOS transistor N11 is longer than the finger length B1 of the NMOS transistor N1. Meanwhile, the finger length b1 of the NMOS transistor N11 is shorter than the finger length A1 of the PMOS transistor P1. Such relations can be summarized as: a1>A1>b1>B1.

As thus described, in the relation between the I/O section 101 and the logic circuit section 102, at least in the MOS transistors of the same conductive type, the finger length of the MOS transistor constituting the logic circuit section 102 is made longer than the finger length of the MOS transistor constituting the I/O section 101.

It is to be noted that, although the relation between the I/O section 101 and the logic circuit section 102 was described above, the same can be applied to the relations between the I/O section 101 and other circuits included in the core circuit section.

This is a configuration not seen in the conventional semiconductor integrated circuit device having the input/output circuit section and the core circuit section.

B-4. Effect

As thus described, by making the finger length of the MOS transistor constituting the input/output circuit section shorter than the finger length of the MOS transistor in the core circuit section, it is possible to suppress the substrate floatation effect with certainty even when the collisional ionization phenomenon apparently occurs at the drain end, so as to prevent deterioration in transistor characteristic caused by the substrate floatation effect.

It is to be noted that both in the P-channel type and the N-channel type, deterioration in transistor characteristic caused by the substrate floatation effect can be prevented.

In addition, although FIG. 4 shows the finger length b1 of the NMOS transistor N11 being shorter than the finger length A1 of the PMOS transistor P1, a case is also contrived where the finger length b1 of the NMOS transistor N11 is longer than the finger length of the PMOS transistor P1, or where both finger lengths are the same.

Here, as a specific example of the case where the finger length of each of the transistors is set so as to establish the relation: a1>b1>A1>B1, the relation: a1 (4 μm)>b1 (2 μm)>A1 (1 μm)>B1 (0.5 μm), can be cited when a semiconductor device called 90-nm node is taken as an example.

Further, the both-side potential fixing has been adopted in all the MOS transistor in the constitutional example of the I/O section 101 and the logic circuit section 102 shown in FIG. 4. When the both-side potential fixing is adopted, the body resistance of the body region can be made substantially half as large as in the case of the one-side potential fixing, thereby leading to enhancement of the effect of suppressing the substrate floatation effect. This means that, in other words, even when the finger length having potentials fixed to both sides thereof is doubled as compared to that of the MOS transistor having a potential fixed to one side thereof, the same degree of inhibitive power against the substrate floatation effect as in the MOS transistor having a potential fixed to one side thereof, and hence adoption of the both-side potential fixing allows setting of a longer finger length.

It should be noted that, as shown in FIG. 4, even when the finger length of the MOS transistor constituting the I/O section 101 is made shorter than the finger length of the MOS transistor constituting the logic circuit section 102, the function of the I/O section 101 would not be impaired so long as the total finger lengths of the MOS transistors (a plurality of MOS transistors being connected in parallel) is made equivalent to the gate width the most constituting the I/O section 101 is required to have.

C. Second Constitutional Example of Device

Figure 5:
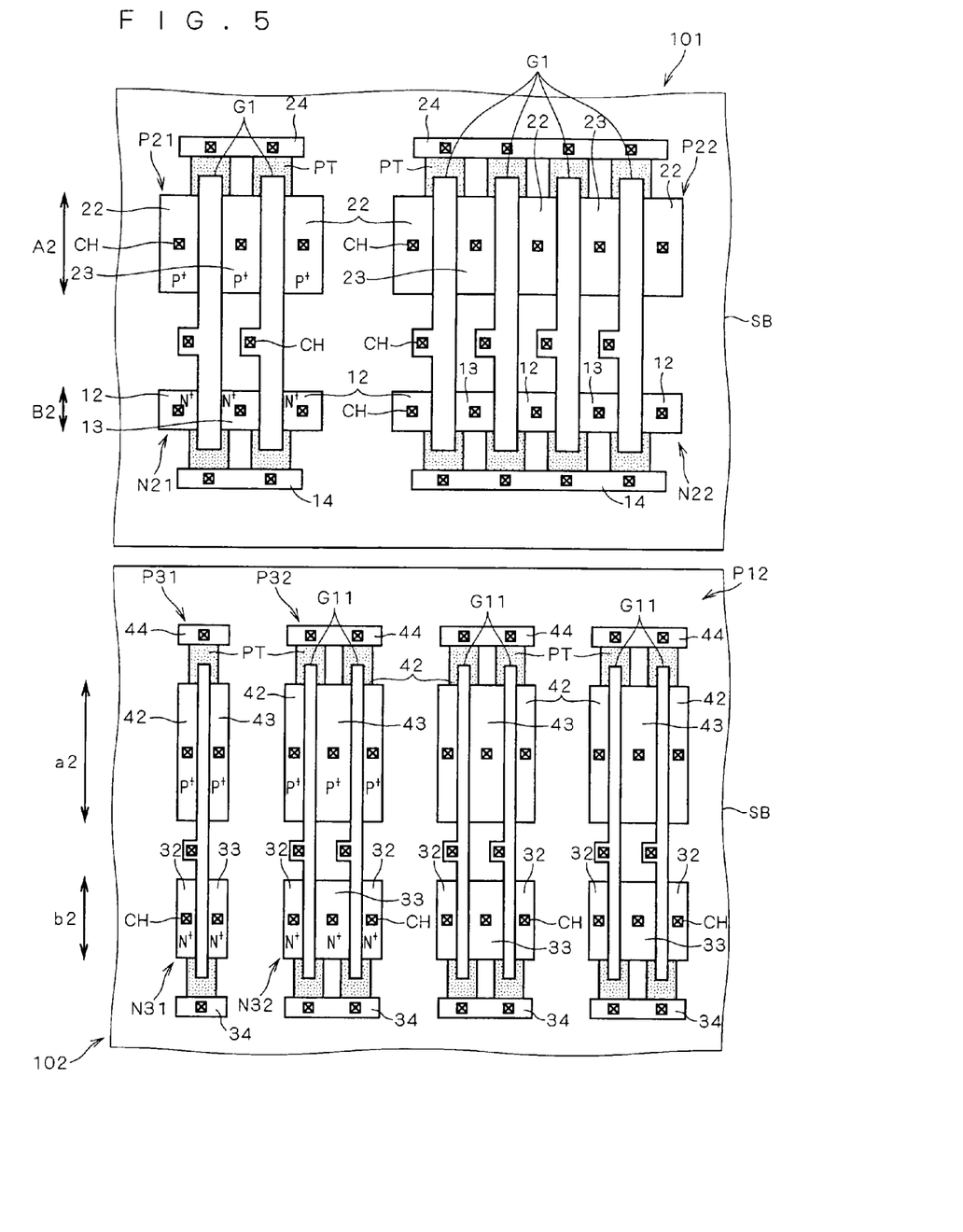
FIG. 5 is a plan view for explaining a second constitutional example of the semiconductor integrated circuit device according to the present invention.

Next, a second constitutional example of the I/O section 101 and the logic circuit section 102 is described using FIG. 5.

C-1. Configuration of I/O Section

In FIG. 5, the I/O section 101 is provided with: a transistor column where a PMOS transistor P21 and an NMOS transistor N21 are provided in parallel in the gate width direction, and the gate electrodes G1 of both transistors are connected so as to be a common gate electrode; and a transistor column where a PMOS transistor P22 and an NMOS transistor N22 are provided in parallel in the gate width direction, and the gate electrodes G1 of both transistors are connected so as to be a common gate electrode.

It is to be noted that the basic transistor structures of the PMOS transistor P21 and the NMOS transistor N21 are the same as those of the PMOS transistor P1 and the NMOS transistor N1 which were described using FIG. 4 and descriptions thereof are thus omitted. Accordingly, each of the PMOS transistor P21 and the NMOS transistor N21 has a configuration where the two MOS transistors are connected in parallel, but those are treated as one transistor for the sake of convenience.

The body contact regions 24 and 14 are provided on the outside of both ends of the two gate electrodes G1 in the gate width direction of the PMOS transistor P21 and the NMOS transistor N21, in positions apart from the respective active regions. The partial trench isolation insulating film PT is provided between the body contact regions 24 and 14 and the respective active regions of the PMOS transistor P21 and the NMOS transistor N21, and each of the body contact regions 24 and 14 are electrically connected to the body region through an SOI layer (well region) under the partial trench isolation insulating film PT.

Therefore, in the PMOS transistor P21 and the NMOS transistor N21, the one-side potential fixing is adopted which fixes a potential of one end out of both ends of the body region in the gate width direction.

It is to be noted that on the periphery of each of the PMOS transistor P21 and the NMOS transistor N21 except for the portion provided with the partial trench isolation insulating film, the full trench isolation insulating film is formed.

Further, each of the PMOS transistor P22 and the NMOS transistor N22 has four gate electrodes G1 provided in parallel in the gate length direction, and the PMOS transistor P22 has a configuration where four PMOS transistors are connected in parallel, but those are treated as one transistor for the sake of convenience. It should be noted that the basic transistor structure is the same as that of the PMOS transistor P21 and its description is thus omitted.

Similarly, the NMOS transistor N22 has a configuration where four NMOS transistors are connected in parallel, but those are treated as one transistor for the sake of convenience. It should be noted that the basic transistor structure is the same as that of the NMOS transistor N21 and its description is thus omitted.

C-2. Configuration of Logic Circuit Section

Further, the logic circuit section 102 is provided with: a transistor column where a PMOS transistor P31 and an NMOS transistor N31 are provided in parallel in the gate width direction, and the gate electrodes G11 of both transistors are connected so as to be a common gate electrode; and a transistor column where a PMOS transistor P32 and an NMOS transistor N32 are provided in parallel in the gate width direction, and the gate electrodes G11 of both transistors are connected so as to be a common gate electrode.

It should be noted that the basic transistor structures of the PMOS transistor P31 and the NMOS transistor N31 are the same as those of the PMOS transistor P11 and the NMOS transistor N11 which were described using FIG. 4 and descriptions thereof are thus omitted.

The body contact regions 44 and 34 are provided on the outside of both ends of the two gate electrodes G1 in the PMOS transistor P31 and the NMOS transistor N31 in the gate width direction, in positions apart from the respective active regions. The partial trench isolation insulating film PT is provided between the body contact regions 44 and 34 and the respective active regions of the PMOS transistor P31 and the NMOS transistor N31, and each of the body contact regions 44 and 34 are electrically connected to the body region through the SOI layer (well region) under the partial trench isolation insulating film PT.

Therefore, in the PMOS transistor P31 and the NMOS transistor N31, the one-side potential fixing is adopted, which fixes a potential of one end out of both ends of the body region in the gate width direction.

Further, each of the PMOS transistor P32 and the NMOS transistor N32 has two gate electrodes G11 provided in parallel in the gate length direction, and the PMOS transistor P32 has a configuration where four PMOS transistors are connected in parallel, but those are treated as one transistor for the sake of convenience. It should be noted that the basic transistor structure is the same as that of the PMOS transistor P31 and its description is thus omitted.

Similarly, the NMOS transistor N32 has a configuration where four NMOS transistors are connected in parallel, but those are treated as one transistor for the sake of convenience. It should be noted that the basic transistor structure is the same as that of the NMOS transistor N31 and its description is thus omitted.

C-3. Comparison Between I/O Section and Logic Circuit Section

Next, MOS transistors constituting the I/O section 101 and the logic circuit section 102 is subjected to comparison with reference to FIG. 5.

First, a focus is placed on the transistor column consisting of the PMOS transistor P21 and the NMOS transistor N21 in the I/O section 101. This transistor column is configured such that a finger length A2 of the gate electrode G1 of the PMOS transistor P21 is made about twice as long as a finger length B2 of the gate electrode G1 of the NMOS transistor N21. This also applies to the PMOS transistor P22 and the NMOS transistor N22.

Here, a focus is placed on the transistor column consisting of the PMOS transistor P31 and the NMOS transistor N31 in the logic circuit section 102. This transistor column is configured such that a finger length a2 of the gate electrode G11 of the PMOS transistor P31 is made about twice as long as a finger length b2 of the gate electrode G11 of the NMOS transistor N31. This also applies to the PMOS transistor P32 and the NMOS transistor N32.

Next, a focus is placed on the finger length of each of the PMOS transistor P21 and the NMOS transistor N21 in the I/O section 101 and the PMOS transistor P31 and the NMOS transistor N31 in the logic circuit section 102, to find the magnitude relation of these finger lengths as follows.

Namely, the finger length a2 of the PMOS transistor P31 is longer than the finger length A2 of the PMOS transistor P21, and the finger length b2 of the NMOS transistor N31 is longer than the finger length B2 of the NMOS transistor N21.

Meanwhile, the finger length b2 of the NMOS transistor N31 is shorter than the finger length A2 of the PMOS transistor P21. Such a relation can be summarized as: a2>A2>b2>B2.

As thus described, in the relation between the I/O section 101 and the logic circuit section 102, at least in the MOS transistors of the same conductive type, the finger length of the MOS transistor constituting the logic circuit section 102 is made longer than the finger length of the MOS transistor constituting the I/O section 101, which is the same as the constitutional example of the input/output circuit section 101 and the logic circuit section 102 described using FIG. 4.

However, as described before, the one-side potential fixing has been adopted in the PMOS transistors P21 and P22 and the NMOS transistors N21 and N22 in the input/output circuit section 101 and the S transistor P31 and P2 and the NMOS transistors N31 and N32 in the logic circuit section 102, and therefore, the finger length of each of the transistors are set shorter than in the case of adopting the both-side potential fixing.

In addition, although FIG. 5 shows the finger length b2 of the NMOS transistor N31 being shorter than the finger length A2 of the PMOS transistor P21, a case is also contrived where the finger length b2 of the NMOS transistor N31 is longer than the finger length of the PMOS transistor P21, or where both finger lengths are the same.

Here, as a specific example of the case where the finger length of each of the transistors is set so as to establish the relation: a2>b2>A2>B2, the relation: a2 (2 μm)>b2 (1 μm)>A2 (0.5 μm)>B2 (0.25 μm), can be cited when the semi conductor device called 90-nm node is taken as an example.

It is to be noted that, although the relation between the I/O section 101 and the logic circuit section 102 was described above, the same can be applied to the relations between the I/O section 101 and other circuits included in the core circuit section.

C-4. Effect

As thus described, by making the finger length of the MOS transistor constituting the input/output circuit section shorter than the finger length of the MOS transistor in the core circuit section, it is possible to suppress the substrate floatation effect with certainty even when the collisional ionization phenomenon apparently occurs at the drain end, so as to prevent deterioration in transistor characteristic caused by the substrate floatation effect. This applies to both the P-channel type and the N-channel type.

It is to be noted that, although adoption of the MOS transistor having a potential fixed to one side thereof requires setting of the finger length of each transistor to be shorter than in the case of adoption of the MOS transistor having potentials fixed to both sides thereof, the MOS transistor can be structurally simplified as compared to the MOS transistor having potentials fixed to both sides thereof, since only a limited portion is necessary as a region for forming the partial trench isolation insulating film. Hence an area efficiency of the MOS transistor can be enhanced, thereby allowing an increased packing density.

Moreover, when the partial trench isolation insulating film is formed so as to surround the drain region and the source region, a PN junction is formed at a contact portion between the SOI layer under the partial trench isolation insulating film and the drain region and/or the source region. A performance characteristic of the MOS transistor may be affected if junction leakage occurs at the PN junction portion, and there hence is an advantage in adopting the one-side potential fixing in that only a small region for forming the partial trench isolation insulating film is necessary.

D. Third Constitutional Example of Device

Figure 6:
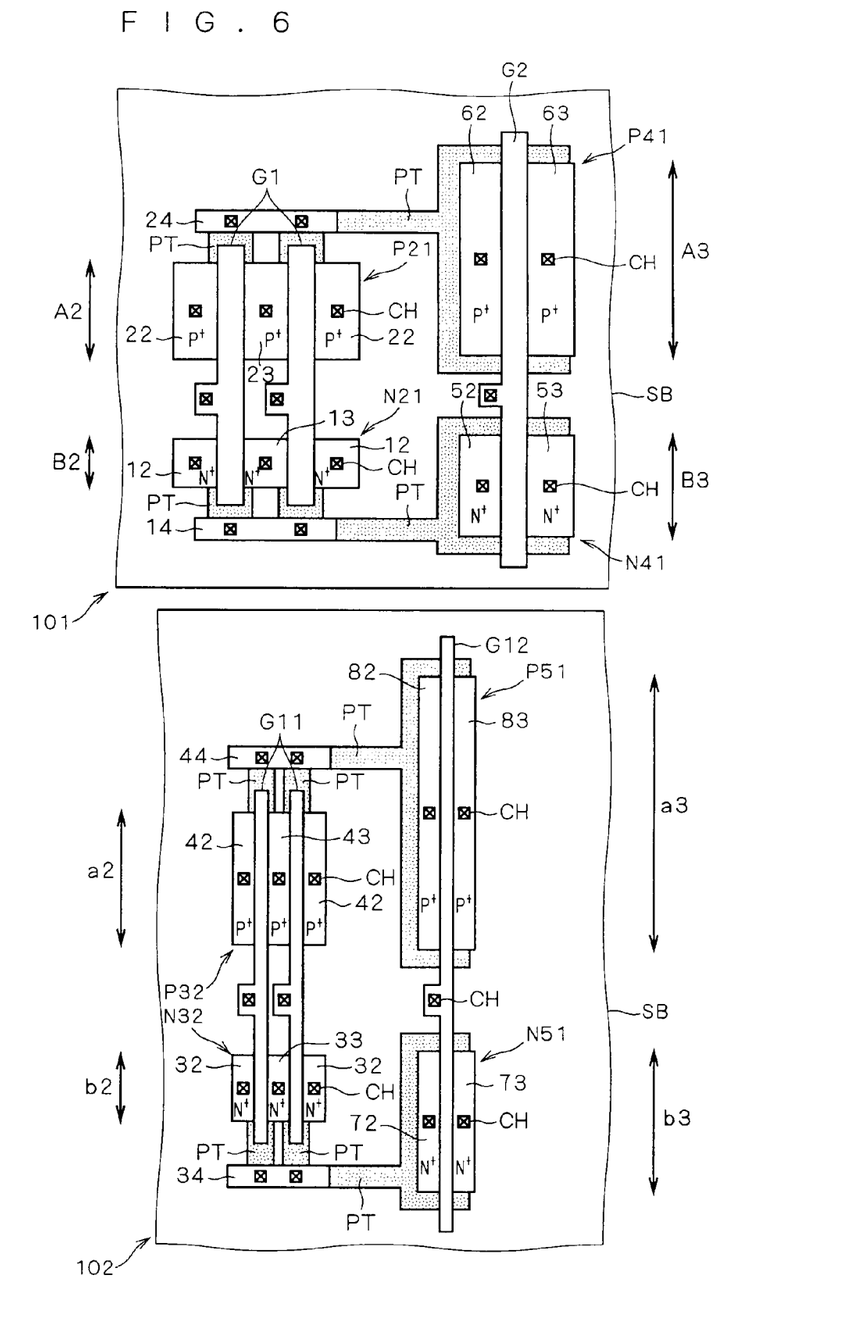
FIG. 6 is a plan view for explaining a third constitutional example of the semiconductor integrated circuit device according to the present invention.

Next, a third constitutional example of the I/O section 101 and the logic circuit section 102 is described using FIG. 6.

D-1. Configuration of I/O Section

In FIG. 6, the I/O section 101 is provided with: a transistor column where a PMOS transistor P21 and an NMOS transistor N21 are provided in parallel in the gate width direction, and the gate electrodes G1 of both transistors are connected so as to be a common gate electrode; and a transistor column where a PMOS transistor P41 and an NMOS transistor N41 are provided in parallel in the gate width direction, and the gate electrodes G2 of both transistors are connected so as to be a common gate electrode.

Here, the PMOS transistor P21 and the NMOS transistor N21 are the same as those described using FIG. 5, and descriptions thereof are thus omitted.

The number of gate electrodes G2 in common between the PMOS transistor P41 and the NMOS transistor N41 is one, and in the PMOS transistor P41, a source region 62 and a drain region 63 in which the P-type impurities have been introduced are provided on the outside of both side surfaces of the gate electrode G2 in the gate length direction within the surface of the SOI substrate SB.

Similarly, in the NMOS transistor N41, a source region 52 and a drain region 53 in which the N-type impurities have been introduced are provided on the outside of both side surfaces of the gate electrode G2 in the gate length direction within the surface of the SOI substrate SB.

In the PMOS transistor P41, the periphery of the source region 62 is surrounded by the partial trench isolation insulating film PT, and the partial trench isolation insulating film PT is provided so as to be in contact with both side surfaces of the drain region 63 in the gate width direction.

Similarly, in the NMOS transistor N41, the periphery of the source region 52 is surrounded by the partial trench isolation insulating film PT, and the partial trench isolation insulating film PT is provided so as to be in contact with both side surfaces of the drain region 53 in the gate width direction.

The partial trench isolation insulating film PT surrounding the source region 62 of the PMOS transistor P41 is provided such that part thereof reaches a body contact region 24 provided on the outside of the end of the gate electrode G1 in the gate width direction of the PMOS transistor P21.

Further, the partial trench isolation insulating film PT surrounding the source region 52 of the NMOS transistor N41 is provided such that part thereof reaches a body contact region 14 provided on the outside of the end of the gate electrode G1 in the gate width direction of the NMOS transistor N21.

Adoption of such a configuration allows fixing of a potential of each end of the body region in the gate width direction in each of the PMOS transistor P41 and the NMOS transistor N41, thereby making body resistance of the body region substantially half as large as in the case of the one-side potential fixing, so that the effect of suppressing the substrate floatation effect is increased.

It is therefore possible to make the finger length of the PMOS transistor P41 and the NMOS transistor N41 longer than that of the PMOS transistor P21 and the NMOS transistor N21 which have a potential fixed to one side thereof D-2. Configuration of Logic Circuit Section In FIG. 6, the logic circuit section 102 is provided with: a transistor column where a PMOS transistor P32 and an NMOS transistor N32 are provided in parallel in the gate width direction, and the gate electrodes G11 of both transistors are connected so as to be a common gate electrode; and a transistor column where a PMOS transistor P51 and an NMOS transistor N51 are provided in parallel in the gate width direction, and the gate electrodes G12 of both transistors are connected so as to be a common gate electrode.

Here, the PMOS transistor P32 and the NMOS transistor N32 are the same as those described using FIG. 5, and descriptions thereof are thus omitted.

The number of gate electrodes G12 in common between the PMOS transistor P51 and the NMOS transistor N51 is one, and in the PMOS transistor P51, a source region 82 and a drain region 83 in which the P-type impurities have been introduced are provided on the outside of both side surfaces of the gate electrode G2 in the gate length direction within the surface of the SOI substrate SB.

Similarly, in the NMOS transistor N51, a source region 72 and a drain region 73 in which the N-type impurities have been introduced are provided on the outside of both side surfaces of the gate electrode G 12 in the gate length direction within the surface of the SOI substrate SB.

In the PMOS transistor P51, the periphery of the source region 82 is surrounded by the partial trench isolation insulating film PT, and the partial trench isolation insulating film PT is provided so as to be in contact with both side surfaces of the drain region 83 in the gate width direction.

Similarly, in the NMOS transistor N51, the periphery of the source region 72 is surrounded by the partial trench isolation insulating film PT, and the partial trench isolation insulating film PT is provided so as to be in contact with both side surfaces of the drain region 73 in the gate width direction.

The partial trench isolation insulating film PT surrounding the source region 82 of the PMOS transistor P51 is provided such that part thereof reaches a body contact region 44 provided on the outside of the end of the gate electrode G11 in the gate width direction of the PMOS transistor P32.

The partial trench isolation insulating film PT surrounding the source region 72 of the NMOS transistor N51 is provided such that part thereof reaches a body contact region 34 provided on the outside of the end of the gate electrode G11 in the gate width direction of the NMOS transistor N32.

Adoption of such a configuration allows fixing of a potential of each end of the body region in each of the PMOS transistor P51 and the NMOS transistor N51, thereby making the body resistance of the body region substantially half as large in the gate width direction as in the case of fixing of the body region, so that the effect of suppressing the substrate floatation effect is increased.

It is therefore possible to make the finger length of the PMOS transistor P51 and the NMOS transistor N51 longer than that of the PMOS transistor P32 and the NMOS transistor N32 which have a potential fixed to one side thereof.

D-3. Comparison Between I/O Section and Logic Circuit Section

Next, MOS transistors constituting the I/O section 101 and the logic circuit section 102 is subjected to comparison with reference to FIG. 6.

The I/O section 101 is provided with the PMOS transistor P41 and the NMOS transistor N41 which have potentials fixed to both sides thereof, and the PMOS transistor P21 and the NMOS transistor N21 which have a potential fixed to one side thereof.

As described above, the finger length of the MOS transistor having potentials fixed to both sides thereof can be made longer than that of the MOS transistor having a potential fixed to one side thereof. A finger length A3 of the gate electrode G2 of the PMOS transistor P41 and a finger length B3 of the gate electrode G2 of the NMOS transistor N41 are configured to be about twice as long as the finger length A2 of the gate electrode G1 of the PMOS transistor P21 and the finger length B2 of the gate electrode G1 of the NMOS transistor N21.

The logic circuit section 102 comprises the PMOS transistor P51 and the NMOS transistor N51 which have potentials fixed to both sides thereof and the PMOS transistor P32 and the NMOS transistor N32 which have a potential fixed to one side thereof. A finger length a3 of the gate electrode G12 of the PMOS transistor P51 and a finger length b3 of the gate electrode G12 of the NMOS transistor N51 are configured to be about twice as long as the finger length a2 of the gate electrode G11 of the PMOS transistor P32 and the finger length b2 of the gate electrode G11 of the NMOS transistor N32.

Next, a focus is placed on the finger length of each of the PMOS transistor P21, the NMOS transistor N21, the PMOS transistor P41 and the NMOS transistor N41 in the I/O section 101, and the PMOS transistor P32, the NMOS transistor N32, the PMOS transistor P51 and the NMOS transistor N51 in the logic circuit section 102, to find the magnitude relation of these finger lengths as follows.

Namely, the finger length a2 of the PMOS transistor P32 is longer than the finger length A2 of the PMOS transistor P21, and the finger length b2 of the NMOS transistor N32 is longer than the finger length B2 of the NMOS transistor N21.

Meanwhile, the finger length b2 of the NMOS transistor N32 is shorter than the finger length A2 of the PMOS transistor P21. Such a relation can be summarized as: a2>A2>b2>B2.

Further, the finger length a3 of the PMOS transistor P51 is longer than the finger length A3 of the PMOS transistor P41, and the finger length b3 of the NMOS transistor N51 is longer than the finger length B3 of the NMOS transistor N41.

Meanwhile, the finger length b3 of the NMOS transistor N51 is shorter than the finger length A3 of the PMOS transistor P41. Such a relation can be summarized as: a3>A3>b3>B3.

As thus described, the relation between the I/O section 101 and the logic circuit section 102 is the same as in the constitutional example of the I/O section 101 and the logic circuit section 102 which was described using FIG. 4 in that at least in the MOS transistors of the same conductive type, the finger length of the MOS transistor constituting the logic circuit section 102 is set so as to be longer than the finger length of the MOS transistor constituting the I/O section 101.

However, as described before, since the finger length of the MOS transistor having potentials fixed to both sides thereof can be made longer than that of the MOS transistor having a potential fixed to one side thereof, even when the transistors are of the same conductive type, the finger length of the PMOS transistor P41 having potentials fixed to both sides thereof is longer than that of the PMOS transistor P32 having a potential fixed to one side thereof.

The finger length of the MOS transistor constituting the I/O section 101 may be longer than that of the logic circuit section 102 if systems for fixing a potential are different between the two MOS transistors even of the same conductive type. However, as described above, when the conductive types as well as the potential fixing systems are the same between the two MOS transistor, the finger length of the MOS transistor constituting the logic circuit section 102 is set so as to be longer than the finger length of the MOS transistor constituting the I/O section 101.

It is to be noted that, although the relation between the I/O section 101 and the logic circuit section 102 was described above, the same can be applied to the relations between the I/O section 101 and other circuits included in the core circuit section.

In addition, in the MOS transistors constituting the I/O section 101 and the logic circuit section 102 shown in FIG. 6, the NMOS transistor N21 of the I/O section 101 and the NMOS transistor N32 in the logic circuit section 102 were shown as the MOS transistors having a potential fixed to one side thereof, but those NMOS transistors may be made ones having potentials fixed to both sides thereof since the substrate floatation effect is apt to occur in an NMOS transistor.

D-4. Effect

As thus described, by making the finger length of the MOS transistor constituting the input/output circuit section shorter than the finger length of the MOS transistor in the core circuit section, it is possible to suppress the substrate floatation effect with certainty even when the collisional ionization phenomenon apparently occurs at the drain end, so as to prevent deterioration in transistor characteristic caused by the substrate floatation effect. This applies to both the P-channel type and the N-channel type.

It is to be noted that in the case of mixed mounting of both the MOS transistor having a potential fixed to one side thereof and the MOS transistor having potentials fixed to both sides thereof, as for the NMOS transistors of the same conductive type with potentials fixed in the same system, it is possible to obtain the above effect by setting the finger length of the NMOS transistor constituting the logic circuit section 102 so as to be longer than the finger length of the MOS transistor constituting the I/O section 101.

This can be translated into as follows. In this case, the input/output circuit section and the core circuit section have a plurality of kinds of MOS transistors with different finger lengths, and the maximum finger length among the finger lengths of the plurality of kinds of MOS transistors in the input/output circuit section is shorter than the maximum finger length among the finger lengths of the plurality of kinds of MOS transistors in the core circuit section, which allows prevention of deterioration in transistor characteristic caused by the substrate floatation effect.

E. Modified Example

In the above embodiments according to the present invention, the semiconductor integrated circuit device was configured on the SOI substrate, and it was described that a crystal orientation and a crystal plane orientation of the SOI layer area are identical over the SOI substrate surface and that the finger length of the PMOS transistor is basically set to twice as long as that of the NMOS transistor.

This is due to a current driving capacity of the PMOS transistor being about half as large as that of the NMOS transistor. However, recently, a technique for producing an SOI substrate with its crystal orientation or crystal plane orientation partially changed has been disclosed.

For example, in "High Performance CMOS Fabricated on Hybrid Substrate With Different Crystal Orientations" (M. Yang et al., IEDM 2003, pp. 453-456), a crystal plane orientation of an SOI layer in a region forming a PMOS transistor is set to a (110) plane, and a crystal plane orientation of the SOI layer in a region forming a PMOS transistor is set to a (100) plane, to set a channel direction of the PMOS transistor to a <110> direction and a channel direction of the NMOS transistor to a <100> direction.

Adoption of this configuration enables enhancement in current driving power of the PMOS transistor, so as to set the finger length of the PMOS transistor to two-thirds of the finger length of the NMOS transistor.

Figure 7:
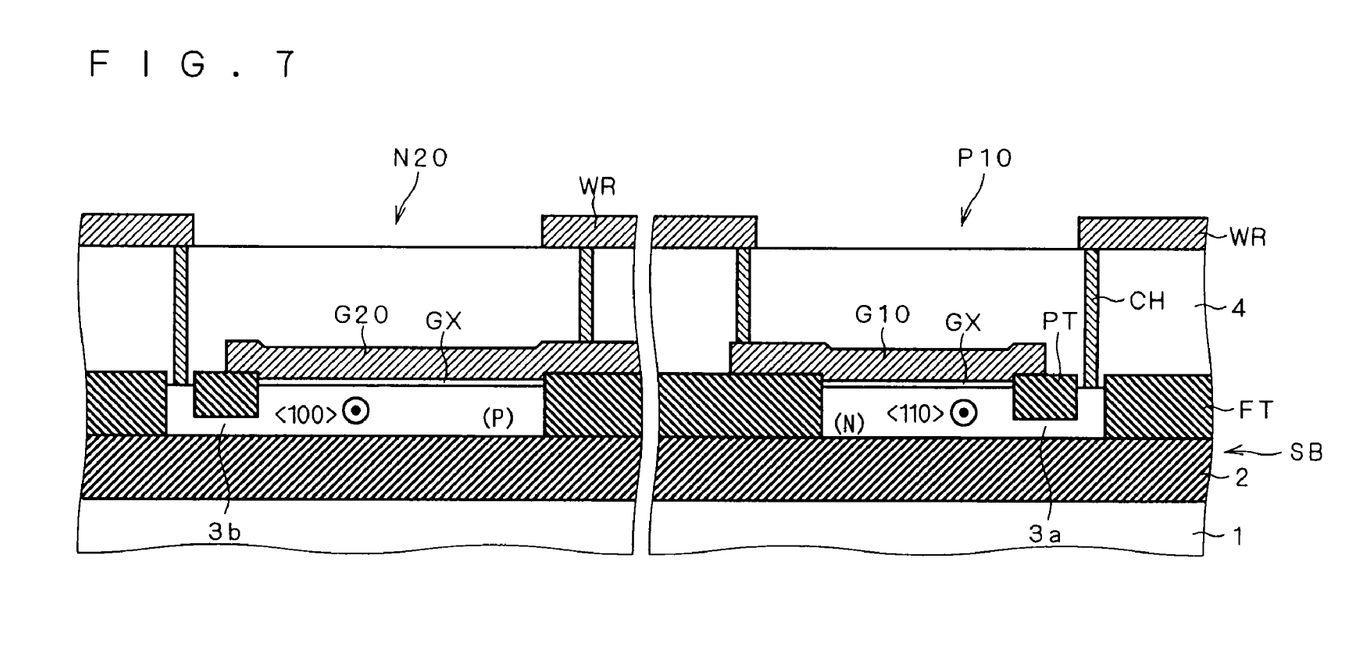
FIG. 7 is a semiconductor integrated circuit device provided on an SOI substrate whose crystal plane orientation has been partially changed.

FIG. 7 shows a sectional view in the gate width direction in the case of forming a PMOS transistor P10 on the SOI layer 3a having the (110) plane and an NMOS transistor N20 on the SOI layer 3 having the (100) plane.

As shown in FIG. 7, a configuration is made such that the buried oxide film 2 and the SOI layer 3 are sequentially formed on the silicon substrate 1, and part of the SOI layer 3 has the (110) plane as the SOI layer 3a.

Since the direction perpendicular to the paper surface is the crystal orientation <100> in the SOI layer 3 and the direction perpendicular to the paper surface is the crystal orientation <110> in the SOI layer 3a, the channel direction of the NMOS transistor N20 is the <100> direction and the channel direction of the PMOS transistor P10 is the <110> direction.

The finger length of the gate electrode G10 of the PMOS transistor P10 is configured to be about two-thirds as long as that of the gate electrode G10 of the PMOS transistor P10.

It should be noted that the gate insulating film GX is provided between the gate electrode G10 and the SOI layer 3a, and the gate electrode G20 and the SOI layer 3.

Further, a configuration is made such that the interlayer insulating film 4 is provided so as to cover the surface of the SOI substrate SB including the gate electrodes G10 and G20, and the wiring layer WR is provided on the interlayer insulating film 4 to be brought into contact with the contact portion CH.

Since adoption of the configuration as described above leads to setting of the finger length of the PMOS transistor to two-thirds as long as that of the NMOS transistor, the finger length of the PMOS transistor may be set to two-thirds as long as that of the NMOS transistor within the same circuit section when the two MOS transistor have potentials fixed in the same system. Hence, the configuration is not limited to one as shown in FIG. 4, for example, where the finger length of the gate electrode G1 of the PMOS transistor P1 is about twice as long as the finger length of the gate electrode G1 of the NMOS transistor N1.

Further, although the semiconductor integrated circuit device is configured on the SOI substrate in the embodiments according to the present invention as thus described, for example in Japanese Patent Application Laid-Open No. 1996-213562, a semiconductor device is proposed, which comprises an SOI substrate region and a bulk substrate region and in which an input/output circuit is formed in the bulk substrate region while an internal circuit is formed in the SOI substrate region.

When such a configuration is adopted, it is preferable that the finger length of the MOS transistor constituting the circuit section formed in the bulk substrate region be set so as to avoid restriction on area, and the restriction on finger length according to the present invention be applied to the circuit section formed in the SOI substrate region.

While the invention has been shown and described in detail, the foregoing description is in all aspects illustrative and not restrictive. It is therefore understood that numerous modifications and variations can be devised without departing from the scope of the invention.

What is claimed is:

1. A semiconductor integrated circuit device, provided on an SOI substrate and comprising:
   an input/output circuit section; and
   a core circuit section, which is provided more internally than said input/output circuit section and operates at a lower power supply voltage than said input/output circuit section, wherein
   said input/output circuit section has a first MOS transistor of a first conductivity type,
   said core circuit section has a second MOS transistor of said first conductivity type,
   a first finger length of a first gate electrode of said first MOS transistor, which is defined by a gate electrode extending direction length of a portion on an active region, is set shorter than a second finger length of a second gate electrode of said second MOS transistor, which is defined by a gate electrode extending direction length of a portion on an active region, and
   said first and second MOS transistors include transistors having body regions under said first and second gate electrodes electrically connected to body contact regions provided on the outside of both ends of said first and second gate electrodes in the gate width direction within the surface of said SOI substrate, wherein
   said body contact regions being positioned apart from respective active regions.

2. The semiconductor integrated circuit device according to claim 1, wherein said first conductivity type is P type.

3. The semiconductor integrated circuit device according to claim 1, wherein said first conductivity type is N type.

4. The semiconductor integrated circuit device according to claim 1, wherein
   said input/output circuit section has a third MOS transistor of a second conductivity type,
   said core circuit section has a fourth MOS transistor of said second conductivity type, and
   a third finger length of a third gate electrode of said third MOS transistor in said input/output circuit section, which is defined by a length gate electrode extending direction of a portion on an active region, is set shorter than a fourth finger length of a fourth gate electrode of said fourth MOS transistor in said core circuit section, which is defined by a length gate electrode extending direction of a portion on an active region.

5. The semiconductor integrated circuit device according to claim 4, wherein
   in said input/output circuit section, said third finger length of said third MOS transistor is set shorter than said first finger length of said first MOS transistor, and
   in said core circuit section, said fourth finger length of said fourth MOS transistor is set shorter than said second finger length of said second MOS transistor.

6. The semiconductor integrated circuit device according to claim 5, wherein said first conductivity type is P type, and said second conductivity type is N type.

7. The semiconductor integrated circuit device according to claim 1, further comprising:
   a partial trench isolation portion; and
   a full trench isolation portion, wherein said body contact regions are provided on a boundary portion between said partial and full trench isolation portions.

* * * * *